United States Patent [19]

Neckers

[11] Patent Number: 5,230,986
[45] Date of Patent: Jul. 27, 1993

[54] PHOTOSENSITIVE COMPOSITIONS CONTAINING BENZOSPIROPYRANS AND USES THEREOF

[75] Inventor: Douglas C. Neckers, Perrysburg, Ohio

[73] Assignee: StereoGraphics Limited Partnership, Maumee, Ohio

[21] Appl. No.: 649,100

[22] Filed: Feb. 1, 1991

[51] Int. Cl.$^5$ .............................................. G03F 7/028
[52] U.S. Cl. ...................... 430/281; 430/270; 430/345; 430/916; 430/920; 522/4; 522/16
[58] Field of Search ............... 430/270, 281, 345, 916, 430/920; 522/4, 16

[56] References Cited

U.S. PATENT DOCUMENTS

| | | | |
|---|---|---|---|
| 3,933,509 | 1/1976 | Noguchi et al. | 430/915 X |
| 4,062,686 | 12/1977 | Van Allan et al. | 430/281 |
| 4,225,661 | 9/1980 | Muzyczko | 430/345 X |
| 4,780,393 | 10/1988 | Frommeld | 430/345 X |
| 4,977,511 | 12/1990 | Gottschalk et al. | 430/270 X |
| 4,978,604 | 12/1990 | Banks et al. | 430/281 X |

FOREIGN PATENT DOCUMENTS

| | | | |
|---|---|---|---|
| 59-171950 | 9/1984 | Japan | 430/281 |
| 1-233448 | 9/1989 | Japan | 430/270 |
| 2-294633 | 12/1990 | Japan | 430/270 |

Primary Examiner—Cynthia Hamilton
Attorney, Agent, or Firm—Thompson, Hine and Flory

[57] ABSTRACT

A Photohardenable composition consisting essentially of a free radical polymerizable compound, an electron donating coinitiator, and a benzospiropyran, wherein the benzospiropyran undergoes ring opening to form a merocyanine upon exposure to a actinic radiation or heat and exposure to a second 296 radiation causes the composition to harden.

9 Claims, No Drawings

PHOTOSENSITIVE COMPOSITIONS CONTAINING BENZOSPIROPYRANS AND USES THEREOF

BACKGROUND OF THE INVENTION

The present invention relates to a novel method of photohardening a composition, to novel photohardenable compositions, to photosensitive materials employing them and to methods for two and three dimensional imaging using the same. More particularly, it relates to a chemical method using two photons to harden compositions containing certain photochromic materials by free radical addition polymerization.

The invention further relates to dosimetric devices incorporating benzospiropyrans.

Though it is relatively simple to transmit two dimensional drawings, figures and photographs from one place to another by optical processes such as xerography and photography, three dimensional photography or xerography is essentially unknown. Prior to the present invention three dimensional figures have been made visible or real by a number of different methods. Prior to the present invention, the techniques for doing so have been slow and expensive.

U.S. Pat. No. 4,575,330 to Hull and assigned to 3 D Systems describes a method for forming a three dimensional objec called stereolithography. Stereolithography involves the formation of a three dimensional object additively, i.e., layer by layer. As such, it couples the power of computer graphics, through laser initiated photopolymerization to the formation of a unique, real plastic form Stereolithography, in its original manifestation, employs a He/Cd laser (324 nm), a UV photoinitiator (usually an acetophenone acetal) and a mixture of viscous polyolacrylates. The x,y dimension is controlled by scanning the laser beam over the surface of the polyolacrylate/UV initiator mixture at a rate sufficiently fast to form a gelled layer of fixed depth on an aluminum platform immersed to essentially 100 μ in the polyolacrylate/UV initiator mixture After formation of the first layer the platform is immersed to a depth of 200 μ and a second layer is formed on top of the first. This process is continued in an additive modeling fashion until the unique object is formed. The entire x,y pattern for each of the successive layers of the model is controlled from a computer —either by vector scanning or raster scanning the laser beam from point $X_1, Y_1$ to $X_n, Y_n$.

Among the applications of stereolithography is the formation of models from CAD/CAM. One of the problems in the aforesaid process is that all of the photochemical polymerization events are required to take place at the interface between the monomer and the air. The mixture cannot be penetrated by the initiating beam without causing a polymerization process. In all cases of application to date, the photopolymerization events are carried out on a platform located a small distance under the surface of the photohardenable mixture. At the completion of the formation of a single layer, the platform is dipped further under the surface to expose the top of the formed layer of polymer to additional monomer mixture. This causes a dislocation in the level of the surface layer which comes to equilibrium slowly if left alone, or which can be leveled with a wiping blade artificially. The overall slow step in the three dimensional modeling process when viscous polyolacrylates are used as the prepolymer is the releveling process. It takes a substantial time period for the polyolacrylate mixture to come to dimensional equilibrium after the movement of the platform into the vessel following the formation of the first layer of stereolithogram. It would be desirable to extend the current practice of stereolithography to the formation of polymer internally of a volume of polymerizable composition rather than on its surface and thus obviate the time consuming reequilibration of the surface of a viscous monomer.

U.S. Pat. Nos. 4,041,476, 4,078,229, 4,238,840, 4,466,080, 4,471,470, an 4,333,165 to Swainson and assigned to Formigraphics Engine Corporation disclose a number of concepts which relate to the current invention in which a three-dimensional figure is formed in situ in a medium by causing two dissimilar radiation beams to intersect in the media. In this process, the X, Y and Z axes are scanned within a volume of a photohardenable material. There is no stage and scanning is not limited to the X, Y plane as it is in the Hull process. While the Swainson concepts are interesting in theory, the photochemistries disclosed in the patent do not appear to be commercially satisfactory at least from the standpoint of three dimensional model formation.

SUMMARY OF THE INVENTION

One manifestation of the present invention is photosensitive composition the hpotosensitivity of which can be induced by a activating or triggering stimulus such as an electromagnetic or thermal radiation. The activating stimulus, as for example a beam of light of a particular wavelength, causes a specific chemical change in the composition which renders the composition sensitive to a second source of electromagnetic stimulus. This latter source will be referred to as the writing stimulus or the writing beam. To operate most effectively the change caused by the activating stimulus should be rapidly reversible to the original condition in the absence of the reactivating stimulus. The composition derived from the initial change moreover should be immediately and highly sensitive to the writing stimulus from the second electromagnetic radiation source. In the latter case, we envision the formation of a polymeric material, when the composition activated by the radiation from the triggering source is simultaneously or nearly simultaneously irradiated by a specifically shaped beam from the writing electromagnetic source. If the initial mixture is transparent to the photon of the writing beam, then it only becomes activated in the case of first photon light or heat absorption.

The activation process may be either a photochromic change wherein the triggering process is the absorption of a photo from either a lamp, optical fiber or a laser, or a thermochromic change triggered by heating. These photochromic or thermochromic photopolymerization events, when coupled with stereolithographic techniques, represent a still additional method of forming a three-dimensional object. In summary, the present invention resides in a photochromic photoinitiator system wherein a photochrome is generated which causes a photohardening when irradiated with light of a wavelength preferably different from that absorbed by the original material which undergoes no photopolymerization when irradiated with a light beam which causes it to change color. Regardless of whether the triggering event is photochromic or thermochromic in nature, these processes may be loosely referred to as "two photon processes" since one photon (or heat) will be required to activate the photochemical system and a second photon will be required to cause polymerization.

It would be further desirable in accordance with the invention to extend the wavelengths of the writing device from one end of the accessible optical spectrum (UV) to the other (IR). By extending the wavelengths of the photochromic, photohardenable compositions over wide spectral ranges, the amount of overlap of the activating beam sensitive material and the writing beam sensitive material is minimized.

It has been found that in the presence of olefinically unsaturated monomers, certain well known electron donating species (coinitiator) and certain photochromic benzospiropyrans, when converted either thermally or photochemically to their ring-opened merocyanine form, can be activated by visible light and cause the formation of polymer. It has also been found that the reverse process also works in some cases. The merocyanine form can be activated by visible light and converted to the benzospiropyran form which absorbs radiation and initiates polymerization. In each such procedure, to effect such an occurrence, a first stimulus activates a photoinitiator moiety and a photon subsequently absorbed initiates a photopolymerization event.

As a first step in outlining the chemistry for an approach to a photochromic photoinitiator system, merocyanines of iodinated BSP's were studied and it was found that they initiate photopolymerization in the presence of electron transfer donor coinitiators. A solution of the hydrochloride salt form of 6,8-diiodo BSP, Compound No. 1 below, in TMPTA gives color upon the addition of excess of triethylamine and the colored solution so formed causes polymerization of the TMPTA upon irradiation with a He/Ne laser.

One manifestation of the present invention is a photohardenable composition which comprises a free radical polymerizable compound (also referred to as a monomer), a benzospiropyran, and a coinitiator wherein the benzospiropyran is characterized in that it undergoes a ring opening reaction and forms a merocyanine upon exposure to heat or actinic radiation, and the merocyanine, in the presence of the coinitiator, yields a free radical upon exposure to heat or actinic radiation. In accordance with some of the broader aspects of the invention, the radiation which excites the benzospiropyran and the radiation which excites the merocyanine may be the same or different. They may be the same if a two dimensional image is formed and two photon discrimination is not required. However, for other applications and particularly to form three dimensional images by x,y,z scanning as described herein, the two radiations are distinct and this represents the preferred invention These photohardenable compositions can be used in any of the applications in which photohardenable compositions have been used previously including photoresists and in the Hull stereolithographrc process but they are particularly useful in producing three-dimensional models by processes similar to those hypothesized in the referenced patents to Swainson.

The invention also resides in a new and practical method for the realization of a three-dimensional object. It is a particular object to produce real free-standing objects in which unique shaping is possible, and to do so in the middle of a vat of photohardenable composition by X, Y, Z scanning, as contrasted to at any surface of the vat of composition as disclosed in U.S. Pat. No. 4,575,330 to Hull. This allows for the rapid production of shapes corresponding to computer driven directions, as well as for the production of a large number of such shapes without the use of a mold or milling device as described in U.S. Pat. No. 4,436,684. The invention also provides for the formation of a solid object within another object as for display particularly if the host matrix is a transparent matrix. The invention also provides molds or models from which molds can be made for reproduction of the original on an altered scale, the latter being controlled by computerized three-dimensional directions.

In producing three-dimensional models, the benzospiropyran and the merocyanine preferably react to distinct wavelengths or forms of radiation such that one beam of radiation can be used to convert the benzospiropyran to a merocyanine and a second beam of radiation causes the merocyanine to release or otherwise generate a free radical. In this manner, a vat of the composition can be scanned with the two beams and polymerization will occur only at the points at which intersection of the beams occurs within a -redetermined time (preferably near simultaneously). The time will be a function of the rates of the conversion of be-zospiropyran to the merocyanine and the conversion of the merocyanine to the benzospiropyran. The points of intersection of the beams define all of the internal and surface location of a three-dimensional object which is to be reproduced and in this way a free standing three-dimensional model can be pronouced. In most cases, the beams will be caused to intersect simultaneously, however, the two photon events occur sequentially. First, the benzospiropyran must be caused to convert to the merocyanine and then the merocyanine must be exposed to cause polymerization. Consequently, it is not required that the beams intersect simultaneously. The write beam should be effective if it intersects anytime after conversion to the merocyanine form and before the reverse reaction in which the merocyanine converts to the benzospiropyran. Three dimensional imaging is simplified greatly and is more rapid if these reactions occur rapidly. If the reverse reaction occurs too slowly, it may be necessary to slow the imaging process down such that all points at which polymerization is not desired can return to the condition in which they are not sensitive to the second photon after the activating and writing beams have scanned so that subsequent exposure to the writing beam does not cause undesirable polymerization. For example, if the activating and writing beams perform an X, Y scan in a first plane $Z_1$, the reverse reaction must be allowed to occur before an X, Y scan can be carried but in an adjacent plane $Z_2$. Otherwise scanning in plane $Z_2$ may result in undesired polymerization in the plane $Z_1$.

Another manifestation of the invention is a method for forming two or three dimensional images which includes the step of image-wise exposing- the aforementioned composition to actinic radiation. The term "image-wise expose" is used herein in the same manner as i is used throughout the photographic art to mean to expose differentially to radiation so as to yield an image upon appropriate processing. The term "image" shall include two dimensional and three dimensional images, the latter being more commonly referred to as "models".

Another more specific manifestation of the invention is a method for forming three-dimensional models which comprises generating control; signals which specify the coordinate positions of a plurality of points within a volume of the aforesaid photohardenable composition at which polymerization is desired, in response to those signals scanning the volume with first and second beams of radiation, the first beam causing said benzospiropyran to convert via a ring opening reaction to a merocyanine and the second beam causing the merocyanine, in the presence of a conitiator, to generate free radicals, such that the composition [polymerizes at the points of intersection of the beams. The absorption characteristics of the benzospiropyran and the merocyanine must be sufficiently distinct that the composition is hardened only at the points of intersection of the beams.

Another manifestation of the invention is a photohardenable composition as defined above but characterized in that it contains the aforesaid merocyanine. This manifestation of the invention is both the intermediate obtained upon exposure of the benzospiropyran as well as a starting material in and of itself. As previously mentioned merocyanines, upon exposure to actinic radiation will cyclize and thus become sensitive at a distinct wavelength region where they generate free radicals in the presence of coinitiators. These compositions are also useful in the processes that have been outlined above. The discussion herein will concentrate on the benzospiropyran conversion with the understanding that the "reverse process" based on the merocyanine conversion also can provide a two photon process.

The compositions of the invention are also useful in the Hull process in which the "Z" control is accomplished with a mechanical stage as in the Hull process as has also been mentioned.

The invention also provides a dosimeter which is useful in detecting ultraviolet, visible or infrared radiation (e.g., 250–1000 nm) and, more particularly laser radiation.

DETAILED DESCRIPTION OF THE INVENTION

Benzospiropyrans (BSP) are an important class of compounds which undergo reversible intramolecular transformations forming the merocyanine isomer (MC) either by irradiation (photochromic) o.- by heating (thermochromic) as shown in Equation (1) below. Irradiation of the merocyanine MC in the presence of coinitiators which are reducing agents and unsaturated compounds yields free radicals which initiate polymerization.

merization without converting to the merocyanine. This process is acceptable in two dimensional imaging but must be avoided in three dimensional imaging using X, Y, Z scanning. This process appears to be intensity dependent and hence, by controlling the intensity of the activating beam, direct polymerization via the benzospiropyran can be avoided.

In a more particular embodiment of the invention, iodinated BSP's are converted by UV irradiation or heating to the colored merocyanyne forms which function as visible light photoinitiators. From an appropriate benzospiropyran, the merocyanine can be generated with UV light. Then radiation from a wavelength absorbed by the merocyanine effects free radical generation and photopolymerization.

Previous attempts to utilize certain merocyanines as visible light photoinitiators have not been successful. R. C. Bertelson; W. J. Becker "Research Study on the Application of the NCR Capsular System", Rept. ASD-TR-61-325, Aug. 1961, AD 265564, pp 59–60. However, the merocyanine formed from a UV irradiated film of a 6-nitro substituted BSP (Compound No. 2 below) caused a layer of poly (methyl methacrylate-comethacryloyloxymethyl styrene) on an aluminum plate to show enhanced photosensitivity in the presence of diphenyliodonium hexafluorophosphate (DPI) when subsequently exposed to a He/Ne laser beam. The UV produced colored solution of 6-nitro BSP in trimethylolpropanetriacrylate (TMPTA) gave no substantial polymeric spike by irradiation with a He/Ne laser (632 nm, 16 mx) or with an argon ion laser (514 nm, 200 mw) in the presence of oxidative coinitiators including diphenylmethylsulfonium tetrafluoroborate, or reductive coinitiators such as the ammonium alkyltriphenylborates or tertiary amines.

BSP's useful in the present invention include those represented by the formula (I):

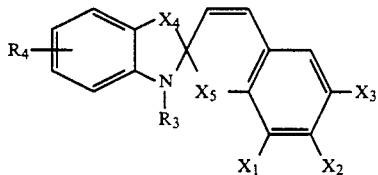

where $X_4$ represents the atoms necessary to complete an

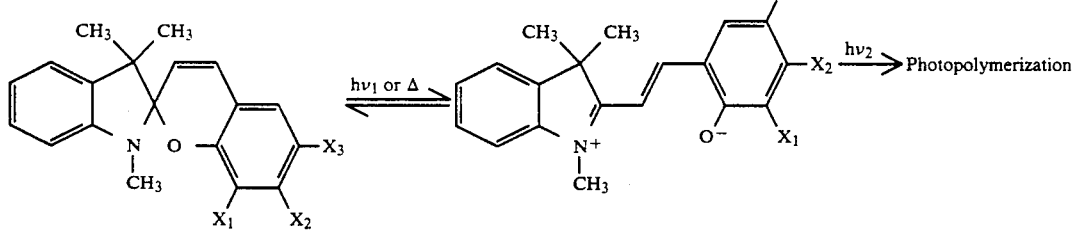 (Eq 1)

There is also a "reverse" process which may also be useful as shown in equation 1A:

Eq. 1A

Given equation 1 and 1A, it will be apparent that exposure of the penzospiropyran alone will yield polymerization indoline, 1,3-thiazazoloidine, 1,3-oxazalidine, pyrrolidine, 1,3-thiazine, 1,4-thiazine, 1,3-oxazine, piperidine, phenanthridine, acridine, quinoline, benzodithiole, benzoxathiazole, 2H-chromene, xanthene or dithiole ring wherein, when a methylene group is present in said ring, it may be of the formula $CR^1R^2$ where $R^1$ and $R^2$ are defined below, $X_5$ represents O, S, Se or $CR^1R^2$ where $R^1$ and $R^2$ are the same or different and are selected from alkyl, arylalkyl, aryl, and hydrogen; $R_3$ represents alkyl, aralkyl, alkylamino, arylamino, or amido; $X_1$ and $X_3$ are the same or different and represent hydrogen, iodo, nitro, cyano, bromo, chloro, fluoro, or amino provided at least one of the two groups $X_1$ and $X_3$ is not hydrogen; and $X_2$ represents hydrogen, alkoxy, a carboxy ester, or amino; and $R_4$ may be hydrogen, fluoro, chloro, bromo, iodo, nitro, alkoxy, carboxy ester, aryl, amino, or cyano or $R_4$ may represent the atoms necessary to complete a condensed benzene ring.

The term "alkyl" as used herein refers to alkyl groups having 1 to 20 (more typically 1 to 10) carbon atoms which may be straight chain, branched chain or cyclic alkyl groups. The term "alkoxy" refers to alkoxy groups having 1 to 20 (more typically 1 to 10) carbon atoms which may be straight or branched chain and include methoxy, ethoxy, etc. The term "aryl" as used herein refers to aryl groups having 6 to 10 carbon atoms such as phenyl and naphthyl. The term "aralkyl" refers to aralkyl groups having 7 to 20 carbon atoms including benzyl. The term "alkylaryl" means alkylaryl groups having 7 to 20 carbon atoms including methylphenyl, etnylphenyl, etc. The term "amido" refers to groups of the structure —$CONR_2$ and the term "carboxy ester" refers to groups of the structure —COOR where R can be hydrogen, alkyl or aryl in the case of the amido group and R is alky in the case of the ester.

Preferred BSP's useful in the present invention include BSP's represented by the formula (II):

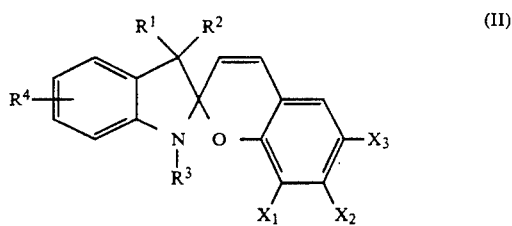
(II)

where $X_1$-$X_3$, $R^1$, $R^2$, $R^3$ and $R^4$ are defined as above.

In still more preferred embodiments, the BSP's are represented by formula (II) and at least one of $X_1$, $X_2$ and $X_3$ is iodo and $R^1$ and $R^2$ are methyl, and $R^3$ is methyl or benzyl.

The ring opened merocyanines corresponding to formula (I) and (II) above are shown in formulas (MC-I) and (MC-II) below:

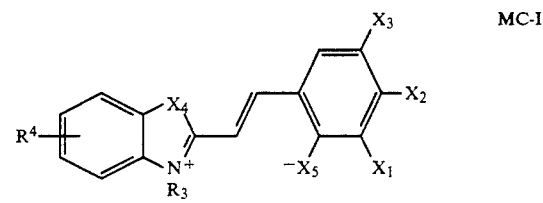
MC-I

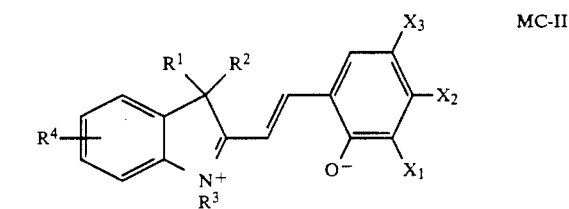
MC-II where like substituents have like definitions and $Z^-$ is an anion such as chloride.

Specific Examples of potentially useful BSP's are shown in the following table.

| Compound No. | X1 | X2 | X3 | X4 | X5 | R1 | R2 | R3 | R4 |
|---|---|---|---|---|---|---|---|---|---|
| 1 | I | H | I | $CR_1R_2$ | O | $CH_3$ | $CH_3$ | $CH_3$ | H |
| 2 | Br | H | Br | $CR_1R_2$ | O | $CH_3$ | $CH_3$ | $CH_3$ | H |
| 3 | I | H | I | $CR_1R_2$ | O | $CH_3$ | $CH_3$ | $CH_3$ | Cl |
| 4 | I | H | $NO_2$ | $CR_1R_2$ | O | $CH_3$ | $CH_3$ | $CH_3$ | H |
| 5 | I | H | $NO_2$ | $CR_1R_2$ | O | $CH_3$ | $CH_3$ | $CH_3$ | Cl |
| 6 | I | H | $NO_2$ | $CR_1R_2$ | O | $CH_3$ | $CH_3$ | $CH_2Ph$ | Cl |
| 7 | Br | H | $NO_2$ | $CR_1R_2$ | O | $CH_3$ | $CH_3$ | $CH_2Ph$ | H |
| 8 | I | $OCH_3$ | $NO_2$ | $CR_1R_2$ | O | $CH_3$ | $CH_3$ | $CH_3$ | H |
| 9 | Cl | $OCH_3$ | $NO_2$ | $CR_1R_2$ | O | $CH_3$ | $CH_3$ | $CH_3$ | H |
| 10 | I | $OCH_3$ | $NO_2$ | $CR_1R_2$ | O | $CH_3$ | $CH_3$ | $CH_2Ph$ | H |
| 11 | I | $OCH_3$ | $NO_2$ | $CR_1R_2$ | O | $CH_3$ | $CH_3$ | $CH_2Ph$ | F |
| 12 | I | H | $NO_2$ | $CR_1R_2$ | O | $CH_3$ | $CH_3$ | $CH_2Ph$ | F |
| 13 | I | H | $NO_2$ | $CR_1R_2$ | O | $CH_3$ | $CH_3$ | Ph | H |
| 14 | I | H | $NO_2$ | $CR_1R_2$ | O | $CH_3$ | $CH_3$ | Ph | $OCH_3$ |
| 15 | I | H | $NO_2$ | $CR_1R_2$ | O | $CH_3$ | $CH_3$ | H | H |
| 16 | I | H | $NO_2$ | $CR_1R_2$ | O | $CH_3$ | $CH_3$ | OCPh | H |
| 17 | I | $OCH_3$ | $NO_2$ | $CR_1R_2$ | O | $CH_3$ | $CH_2Ph$ | H | |
| 18 | I | $OCH_3$ | $NO_2$ | $CR_1R_2$ | O | $CH_3$ | $CH_3$ | $N(CH_3)_2$ | H |
| 19 | I | $OCH_3$ | $NO_2$ | $CR_1R_2$ | O | $CH_3$ | $CH_3$ | $CH_2Ph$ | Ph |
| 20 | I | O OC—$CH_3$ | $NO_2$ | $CR_1R_2$ | O | $CH_3$ | $CH_3$ | $CH_2Ph$ | H |
| 21 | I | H | $NO_2$ | S | O | — | — | $CH_2Ph$ | H |
| 22 | I | $OCH_3$ | $NO_2$ | S | O | — | — | $CH_2Ph$ | H |
| 23 | I | H | $NO_2$ | $CR_1R_2$ | S | $CH_3$ | $CH_3$ | $CH_2Ph$ | H |
| 24 | I | $OCH_3$ | $NO_2$ | $CR_1R_2$ | S | $CH_3$ | $CH_3$ | $CH_2Ph$ | H |

-continued

| Compound No. | X1 | X2 | X3 | X4 | X5 | R1 | R2 | R3 | R4 |
|---|---|---|---|---|---|---|---|---|---|
| 25 | I | H | NO$_2$ | CR$_1$R$_2$ | S | CH$_3$ | CH$_3$ | CH$_2$Ph | Cl |
| 26 | I | OCH$_3$ | NO$_2$ | CR$_1$R$_2$ | O | CR$_3$ | CH$_3$ | CH$_2$Ph | CH$_3$<br>N<br>CH$_3$ |

Several considerations must be given to design optimum BSP's including the absorption spectra and $\Delta$max of the BSP and MC forms, the solubility of the BSP's in the monomer systems, the photocoloration rate and the thermal decay rate of the MC forms, the MC photosensitivity, the amount of initial concentration of the MC form in the monomer solution, the stability of the BSP's and the reduction and oxidation potentials of the MC forms. To illustrate the effect of initial MC form in the monomer consider the following: a solution of 8-chloro-6-nitro BSP in TMPTA shows good photosensitivity. This solution generates a blue color rapidly by UV irradiation and the colored solution rapidly returns to initial solution upon the stopping of the UV irradiation. But this solution cannot be used above $10^{-3}$M in concentration with N-phenylglycine ($2 \times 10^{-2}$M) as a photochromic photoinitiator because the initial equilibrium MC concentration ($\sim$5% PF [BSP]) is high enough to absorb the He/Ne laser radiation (15 mw, 632 nm) and give a polymeric spike. 8-chloro-6-nitro BSP [$2 \times 10^{-4}$M] and $2 \times 10^{-2}$M of N-phenylglycine in TMPTA solution gives no polymeric spike with He/Ne laser irradiation prior to full, UV irradiation of the BSP. Therefore in this case this active BSP must be used at a concentration sufficiently low so the MC form is too dilute to cause polymerization. It has also been found that polar solvents such as ethanol shift the absorption spectrum of MC forms to shorter wavelengths.

In the preferred case for three-dimensional modeling, the BSP and MC nave sufficiently distinct absorption spectra that the BSP can be converted to the without causing the MC to generate free radicals. In two dimensional imaging this is not believed critical.

Coinitiators useful in the present invention can be selected from among those known in the art and, more particularly, from known electron donating coinitiators. N-phenylglycine is a well known and useful coinitiator. Also useful are N,N-dialkylanilines and other, tertiary amines such as, triethanolamine arylsulfinates and organoborate salts. Examples of other useful electron donating coinitiators are discussed by Eaton, D. F., "Dye Sensitized Photopolymerization", *Advances in Photochemistry*, Vol. 13, pp 427–486.

Representative examples of N,N-dialkylanilines useful in the present invention are 4-cyano-N,N-dimethylaniline, 4-acetyl-N,N-dimethylaniline, 4-bromo-N,N-dimethylaniline, 4-methyl-N, N-dimethylaniline, 4-ethoxy-N,N-dimethylaniline, N,N-dimethylthioanicidine, 4-amino-N,N-dimethylaniline, 3-hydroxy-N, N-dimethylaniline, N,N,N,'N,-tetramethyl-1,4-dianiline, 4-acetamido-N,N-dimethylaniline, 2,6-diethyl-N,N-dimethylaniline, N,N,2,4,6-pentanethylaniline (PMA) and p-t-butyl-N,N-dimethylaniline.

Certain other tertiary amines are also useful coinitiators including triethylamine, triethanolamine, etc.

Another class of useful coinitiators are alkyl borate salts such as ammonium salts of borate anions of the formula BR$^5$R$^6$R$^7$R$^8$ where R$^5$-R$^8$ are independently selected from the group consisting of alkyl, aryl, alkaryl, allyl, aralkyl, alkenyl, alkynyl, alicyclic and saturated or unsaturated heterocyclic groups.

Representative examples of alkyl groups represented by R$^5$-R$^8$ are methyl, ethyl, propyl, butyl, pentyl, hexyl, octyl, stearyl, etc. The alkyl groups may be substituted, for example, by one or more halogen, cyano, acyloxy, acyl, alkoxy or hydroxy groups. Representative examples of aryl groups represented by R$^5$-R$^8$ include phenyl, naphthyl and substituted aryl groups such as anisyl and alkaryl such as methylphenyl, dimethylphenyl, etc. Representative examples of aryl groups represented by R$^5$-R$^8$ include benzyl. Representative alicyclic groups include cyclobutyl, cyclopentyl, and cyclohexyl groups. Examples of an alkynyl group aryl propynyl and ethynyl, and examples of alkenyl groups include a vinyl group.

Preferably, at least one but not more than three of R$^5$, R$^6$, R$^7$, and R$^8$ is an alkyl group. Each of R$^5$ R$^6$, R$^7$, and R$^8$ can contain up to 20 carbon atoms, and they typically contain 1 to 7 carbon atoms. More preferably R$^5$-R$^8$ are a combination of alkyl group(s) and arylgroup(s) or aralkyl group(s) and still more preferably a combination of three aryl groups and one alkyl group, i.e., an alkyltriphenylborate.

The most typical example of a free radical addition polymerizable or crosslinkable compound useful in the present invention is an =[thylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethyleneglycol dimethacrylate.

It is often desirable to incorporate a sensitizer in the compositions of the present invention to control the sensitivity of the composition and to extend the sensitivity of the MC such that exposure of the BSP does not initiate free radicals. Useful sensitizers include those known in the art such as anthracene, naphthalene, acetophenone, benzophenone, 2-acetonaphthone, etc.

In addition to using sensitizers to adjust the sensitivity of the compositions of the present invention, other techniques may be used. As previously mentioned, polar solvents have been found to shift the absorption spectrum of the benzospiropyran and hence the inclusion of more polar monomers such as N-vinyl pyrrolidone, solvents such as nitrobenzene and other polar agents can be used to tune the sensitivity of the composition.

The nature of the monomer, the amount of the BSP and coinitiator in photohardenable compositions in accordance with the present invention will vary with the particular use of the compositions, the emission characteristics of the exposure sources, the development procedures, the physical properties desired in the polymerized product and other factors. With this understanding, compositions in accordance with the invention will generally have compositions which fall within the following compositional ranges in parts by weight [based on 100 parts total].

| Polymerizable compound | 50 to 99.7 |
|---|---|
| Benzospiropyran/merocyanine | .02 to .05 |
| Coinitiators | 0.2 to 1 |
| Sensitizer (optional) | 0.3 to 1 |

Compositions in accordance with the invention more typically are anticipated to have the following formulation:

| Polymerizable Compound | 10 g |
|---|---|
| Benzospiropyran/Merocyanine | 2 mg to 10 mg |
| Coinitiators | 20 mg to 100 mg |
| Sensitizer (optional) | 20 mg to 100 mg |

For use in making three-dimensional models, it is important that compositions which are not simultaneously or nearly simultaneously exposed to both radiations do not polymerize. In particular, in scanning a volume of the photohardenable media, as a result of beams passing through previously exposed areas or planes, there will be numerous points in the volume which are sequentially scanned in any order with the BSP-triggering radiation and the MC-writing radiation as the structure of the model is defined in the volume of the medium by the intersection of the beams. Some points may also experience multiple exposures to the BSP-activating and/or MC-writing radiation. It is important that points receiving such multiple exposures do not polymerize. For this reason, it is desirable to select benzospiropyrans which rapidly reverse when they are not being exposed to the BSP-activating radiation. In other words, benzospiropyrans and formulations are selected in which the reaction rate constant $k_2$ for the reaction

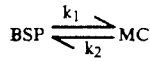

$$BSP \underset{k_2}{\overset{k_1}{\rightleftharpoons}} MC$$

is 0.08 sec$^{-1}$ or less and often between 0.02 and 0.08 sec$^{-1}$. These values are based on compound 1 in ethyl acetate and may vary for other solvents.

In accordance with the preferred embodiments of the invention for three-dimensional imaging or large thickness imaging, it is desirable to select benzospiropyrans for which the absorption maximum is in a wavelength region in which the merocyanine does not exhibit substantial absorption. This has two advantages, first, it simplifies exposure in that activation of the benzospiropyran can occur without generating free radicals by exposure of the merocyanine. Thus, there is greater freedom in selecting the wavelength and intensity of the BSP-activating and the MC-writing radiation. When there is substantial overlap, the intensity of the two radiations must be carefully controlled so as to activate the benzospiropyran without activating the merocyanine. Second, it permits deeper penetration of the volume or layer of the composition as the conversion of the benzospiropyran to the merocyanine has the effect of "bleaching" the benzospiropyran or making it transparent with respect to the MC-activating radiation.

The photohardenable compositions of the present invention can be coated upon a support in a conventional manner and used as a photoresist or in photolithography to form a polymer image; or they can be encapsulated as described in U.S. Pat. Nos. 4,399,209 and 4,440,846 and used to control the release of an image-forming agent. The latter processes typically involve image-wise exposing the photosensitive material to actinic radiation and subjecting the layer of microcapsules to a uniform rupturing force such as pressure, abrasion, or ultrasonic energy.

Development of photohardenable compositions in accordance with the invention is conducted in an otherwise known or conventional manner, e.g., a solvent for the monomer may be used to remove the photohardenable composition in the unexposed areas. The monomers used herein most typically are known in the art as are their solvents.

Generally, BSP's in accordance with the invention absorb at about 300 to 450 nm. Depending upon the extinction coefficient for the BSP, the conversion to the MC form can be induced by exposure to any source which emits in this range and particularly a He/Cd laser, or mercury arc lamps.

The MC form will typically absorb in a range of about 450 to 1000 nm and 450 to 700 most typically. This form (subject to the extinction coefficient for the MC) can be activated to produce free radicals by exposure to any source within this range. For three dimensional or laser exposures, the following sources may be used: argon ion, He-Ne, laser diodes, krypton) etc. For the "reverse" process, the MC form will be activated by exposure to argon ion, He-Ne, laser diode, and krypton sources and polymerization will be induced by exposure to He/Cd laser or mercury arc lamps.

In forming three-dimensional images or models, the x,y,z volumetric methods described in the Swainson patents can be used or the x,y cross-sectional method described in the Hull patent may be used.

The sensitivity of the benzospiropyran and the merocyanine to different radiation wavelengths permits the compositions of the present invention to be used in the Swainson methods, however, the shift in absorption characteristics which accompanies the conversion of the benzospiropyran to the merocyanine also makes the compositions advantageous to use in the Hull methods. One of the limitations in the Hull method is the depth to which the laser beam can penetrate the photohardenable composition. With the present invention, greater penetration is possible due to the photochromic or thermochromic shift in λ max which accompanies the conversion of the benzospiropyran to the merocyanine. As the benzospiropyran is exposed at the surface of the photohardenable media, the media becomes transparent to the exposure radiation. Consequently, whereas with conventional photohardenable compositions the surface of the media absorbs the radiation and limits the depth to which the radiation can penetrate, with the preferred compositions of the invention, exposure converts the surface layer of media from a radiation-absorbing state to a non-absorbing or less absorbing state. The surface layers of media thus permit more radiation to penetrate to greater depths As the radiation penetrates below the surface, the thermochromic or photochromic bleaching effect continues enabling deeper penetration.

Even with the greater depth of cure that is possible in accordance with the invention, it still may not be possible to cure to a depth necessary to form large models due to diffusion of the light beam and absorption of the activating radiation. One possible modification of a Swainson type modeling apparatus which may permit larger model formation is to use light pipes or optical fibers to conduct the radiation into the bath of the polymerizable media. For example, light pipes conducting the radiations can be inserted into the volume of the media and be gradually withdrawn as they scan the points of polymerization. One example of such an approach is described in U.S. Pat. No. 4,801,477. For example, beginning at a lower corner of a cubical volume, the light pipes may scan the bottom face of the cube. After scanning the bottom face, the light pipes may be moved (withdrawn) to the layer of media above the bottom layer which is then scanned in an x,y plane. When scanning of this layer is completed, the pipes are withdrawn to the next layer and the process is continued until the model is formed. One disadvantage of this method is that the medium must allowed to re-equilibrate after each time the pipes are moved.

The invention also includes the use of benzospiropyrans in dosimeters for detecting UV, visible and infrared laser pulses. Because benzospiropyrans undergo a color change when exposed to radiation, they may be used to record and provide a quantitative indication of exposure to acting radiations. For this purpose, they may be dispersed in a compatible binder such as polyvinyl alcohol or polymethyl methacrylate and coated upon a support. When the reversible nature of this color change alone does not permit use in dosimetry (e.g., due to conversion back to the original form), the photohardenable compositions described above can be used.

In addition to being useful in applications in which the benzospiropyran is converted to the merocyanine form, applications are also available in which the conversion of the merocyanine to the benzospiropyran is used. For these applications, the merocyanine form can be generated photochemically or by the action of an acid. Thereafter, polymerization occurs by the mechanisms described above.

Dosimeters in accordance with the invention may operate through several different mechanisms so as to provide the necessary threshold response. One mechanism utilizes the two photon process described above and operates by the following mechanism.

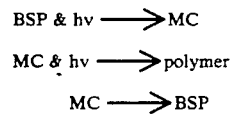

The BSP and MC may absorb photons of the same wavelength. The threshold occurs because the BSP must bleach to a value that is low enough that the MC can cause polymerization. The intensity at which this occurs will depend on the rate with which the BSP is regenerated and on the extension coefficient of the BSP.

The dosimeter can also threshold by quenching when monomers are present and polymerization is carried out in the presence of oxygen and inhibitors present in commercial monomers. Oxygen and inhibitors must be consumed before polymerization can occur. The threshold intensity depends on the competition between the rate of oxygen and inhibitor diffusion and the rate of initiation. The threshold can be adjusted by adjusting the concentration of inhibitors initially present, their rates of diffusion or decreasing the rate of radical generation by quenching the excited state of the initiator in a process which regenerates the initiator and quencher.

A photochromic shielding effect can also be used wherein a layer of the BSP overcoats a photohardenable composition containing another initiator. The transmission of the overcoating containing the BSP depends exponentially on the light intensity and the rate constant for the back reaction from the MC to the BSP. The intensity of the radiation which reaches the underlying layer depends on the transmission of the overcoat and hence an exponential dependence on laser power.

The BSP can also be blended with a material like carbon black which heats as it absorbs laser radiation. The thermal polymerization rate will depend exponentially on temperature.

In summary, one dosimeter in accordance with the invention will comprise a layer of a BSP containing a photohardenable composition on an appropriate substrate such as a metal, polymer film or paper and dosimetery will be a function of the two photon process. In another device, the BSP will be used analogous to other photoinitiators with an inhibitor, the concentration of the inhibitor being adjusted to control the threshold level. In another device, a layer of a BSP or the MC form will overlie a layer of a photohardenable composition. The BSP or MC layer will shield the underlying layer until a threshold amount of radiation has been absorbed which causes a photochromic or thermochromic change in the BSP layer which enables the underlying layer to polymerize by exposure to ambient radiation or radiation of the same nature which excites the BSP or MC and causes that layer to no longer shield the underlying composition.

As a final embodiment the BSP may be combined with carbon black such that a threshold level of heat triggers the BSP to cause polymerization when laser radiation of sufficient intensity is detected.

Benzospiropyrans are prepared routinely from the corresponding salicylaldehydes and 2-methylene-1,3,3-trimethylindoline (A) in ethanol solution as shown in Equation 2. See E. Berman; R. E. Fox; F. D. Thomson; J. Am. Chem. Soc., 1959, 81, 5605. Iodinated compounds were chosen for further study after an initial screening indicated systems without the heavy atom, iodine, might not be as effective.

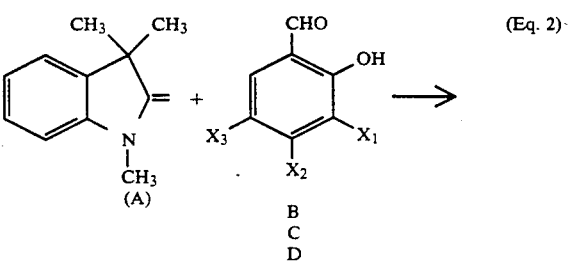

TABLE 1

| Compound No. | λmax(ε*) | Compound No. | λmax(ε*) | Merocyanine Half-Life |
|---|---|---|---|---|
| 1 | 394 nm | MC-1 | 606 nm | 35 sec. |
| 4 | 376 nm(1.51 × 10$^4$) | MC-4 | 572 nm(2.73 × 10$^4$) | 330 sec. |
| 8 | 382 nm(1.19 × 10$^4$) | MC-8 | 568 nm(2.12 · 10$^4$) | 70 sec. |

*These values are obtained by irradiation at 360 nm and simultaneous recording of the absorption spectrum. They are thus values for the photostationery state.

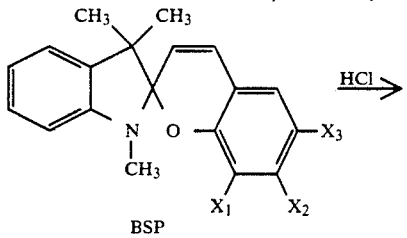

BSP

1*
4*
8*

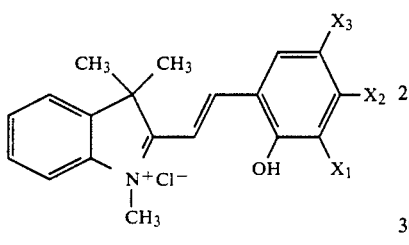

MC

MC-1
MC-4
MC-8

*See table of compounds

Starting material B was prepared from the reaction of 5-nitrosalicylaldehyde with $CF_3CO_2I$. D was prepared from 2-hydroxy-4-methoxybenzaldehyde by subsequent nitration and iodination. Hydrochloric acid salt forms (MC-1, MC-4 and MC-8 were prepared by reaction of the corresponding BSP's (1, 4, and 8) with conc. HCl.

General Photopolymerizations

Photopolymerizations were carried out in a glass cuvette (b=1 cm) by irradiating solutions of BSP's in TMTA. A coinitiator such as a tertiary amine or a trialkylaryl borate and TMPTA with either a He/Ne laser (632 nm, 16 mw) or argon ion laser (514 nm, 100 mw). The polymer spikes formed at different irradiation times, t, were washed with acetone (5×2 ml) and dried under reduced pressure for 5 hrs. before weighing.

General Methods of Forming the Colored Merocyanine Form

The colored, ring opened merocyanines MC-1, MC-4 and MC-8 were formed by one of four different methods: 1) by neutralization of each of the respective hydrochloric acid salts with tertiary amines; 2) by UV (360 nm) irradiation of the benzospiropyrans; 3) by dissolution of the benzospiropyrans in N-2-vinylpyrrolidone which served as a color developing solvent, or 4) by heating the benzospiropyrans. Colored ring opened merocyanines generated individually by the methods above are spectroscopically identical except for slight differences in the value of λ max deriving from polarity changes in the medium. Spectra data nd half lives of the merocyanine forms MC-1, MC-4 and MC-8 in ethyl acetate solution are summarized in Table 1.

The invention is illustrated in more detail by the following non-limiting examples.

EXAMPLE 1

Preparation of 3-iodo-5-nitro salicylaldehyde (C)

A suspension of 1.0 g (5.98 mmol) of 5-nitrosalicylaldehyde, 2.70 g (6.28 mmol) of [(bistrifluoroacetoxy) iodo] benzene, and 1.52 g (5.98 mmol) of iodine in 10 ml of carbon tetrachloride was stirred for 15 hrs. at room temperature. The reaction mixture was diluted with 10 ml of hexane and the the formed solid was collected by filtration, washed with 1% hydrochloric acid, and dried to give 1.6 g of C. 3 (Yield: 91%), $^1$H NMR (CDCl$_3$)δ12.45 (S, 1H), 9.91 (S, 1H), 8.90 (d, J=2.0H$_z$, 1H), 8.59 (d, J=2.0 Hz, 1H); MS (70 eV) m/e (% relative intensity (M+2 =295 (1.3) M+1=294 (7.8) M=293 (100), 246 (4.5), 191 (6), 127 (6) 120 (4.8), 92 (16), 91 (7.5), 74(7) 64)14), 63 (21), 62 (9.5), 61 (6.5), 53 (6.5; IR (nujol) 1661, 1607, 1532, 1456 cm$^{-1}$.

EXAMPLE 2

Preparation of 2-hydroxy-4-methoxy-5-nitrobenazldehyde

To the stirred solution of 5.4 g (35.5 mmol) of 2-hydroxy-4-methoxy benzaldehyde in 15 ml of acetic acid, 10.1 g of fuming HNO$_3$ (90%) was added dropwise the compound at 0° C. After the addition was completed, the reation mixture was slowly warmed to room temperature and the stirring was continued for 21 hrs. at RT. The reaction mixture was poured into cold water and the formed solid was collected by filtration. The crude product was crystallized form ethane on to give 3.9 g of the compound. (Yield: 56%); $^1$HNMR (CDCl$_3$) δ11.8 (s, 1H), 9.8 (s, 1H), 8.3 (s, 1H) 6.6 (s, 1H), 4.05 (s, 3H); MS (7oeV) m/e (% relative intensity )M+1=198 (14), M=197 (100), 196(14), 184 (12) 167 (39), 150 (52), 139 (13), 122 (16), 121 (16), 120 (18, 111 (15), 109 (14), 108 (28), 93 (13), 80 (37), 77 (14), 69 (46), 68 (13), 65 (47), 64 (19), 63 (27), 62 (20), 55 (13), 53 (41), 51 (28); IR (nujol) 1660, 1641, 1460, 1383, 1299 725 cm$^{-1}$.

EXAMPLE 3

Preparation of 2-hydroxy-3-iodo-4-methoxy-5-nitrobenzaldehyde (D)

To the stirred solution of 2.0 g (10.2 mmol) (1.52 mmol) of 4-methoxy-5-nitrosalicylaldehyde and 2.58 g (10.2 mmol) of iodine in 60 ml of carbon tetrachloride, 4.8 g (11.2 mmol) of [bistrifluoroacetoxyl) iodo]benzene was added slowly and then the reaction mixture was stirred for 15 hrs. at RT. To this reaction mixture, 60 ml of hexanes was added and then the formed solid was collected by filtration, washed with hexanes, dilute HCl, water, and dried to give 2.4 g of D. (Yield: 73%): $^1$H NMR (CDCl$_3$) δ12.48 (s, 1H), 9.81 (s, 1H), 8.35 (s, 1H), 4.07 (s, 3H); MS (70 eV) m/e (% relative intensity)

M+2 =325 (1.78), M+1 =324 (11) M=323 (100), 293 (41), 276 (51), 262 (11), 120 (8.5), 119 (8.6), 108 (38), 107 (22), 92 (23), 80 (10) 79 (18), 77 (18), 64 (12), 63 (10), 62 (10), 61 (10), 51 (14), 49 (23); IR (nujol) 1660, 1608, 1557, 1512, 1467, 1376, 1312, 1080, 970, 725 cm$^{-1}$

EXAMPLE 4

Preparation of 6, 8-diiodo-1', 3', 3'-trimethyl spiro [2H-1-benzopyran-2,2'[2H] indole-1', 3'-dihydrol (Compound No. 1), A solution of 3.4 g (9.09 mmol) of 3,5-diiodosalicylaldehyde and 1.58 g (9.12 mmol) of 2-methylene-1,3-trimethylindoline 1,3,3-trimethylindoline in 20 ml of ehtanol was heated to reflux for 5 hrs. After the reaction mixture was cooled to room temperature, the formed solid was collected by filtration to give 3.5 g of Compound No 1. (Yield: 73%); $^1$H NMR (CLCl$_3$)δ7.82 (s, 1H) 7.4–6.5 (m, 6H) 5.75 (d, J=9.6 Hz, 1H), 2.67 (s, 3H), 1.30 (s, 3H), 1.18 (s, 3H); MS (70 eV) m/e (% relative intensity) M=529 (44), 514 (10), 217 (11), 216 (13), 160 (11), 159(100), 158 (38), 144 (25); IR (nujol) 1610, 1460 1430, 1376, 1351, 1305, 1273, 1157, 957, 880, 751 cm$^1$.

EXAMPLE 5

Preparation of 8-iodo-6-nitro-1',3',3'-trimethyl spiro [2H-1-benzopyran-2,2'([2H]indole-1',3'-dihydrol (Compound No. 4)

A solution of 1.0 g (3.41 mmol) of 3-iodo-5-nitrosalicylaldehyde and 590 mg (3.41 mmol) of 2-methylene-1,3,3-timethylindoline in 20 ml of ethanol was heated to reflux for 5 hrs. After the reaction mixture was cooled to room temperature, the formed solid was collected by filtration to give 1.20 g of Compound No. 2. (Yield: 75%); $^1$H NMR (CDCl$_3$) δ8.8–6.55 (m, 7H) 5.90 (d, J=9.5 Hz, 1H), 2.71 (s.3H), 1.32 (s, 3H) 1.23 (s, 3H); MS (70 eV) m/e (% relative intensity) M+1=449 (9.6), M=448 (51), 433 (17), 260 (5), 231 (5), 230 (7,m 217 (10), 216 (11), 204 (5), 180 (5).

EXAMPLE 6

Photopolymerization Using a Thermochromic Process

A solution of Compound No. 4 or No. 8 in TMPTA in the presence of coinitiators such as amines or borates produce intense blud colores upon heating. Irradiation of this colored solution with a He/Ne laser gives a polymeric spike. A solution of Compound No. 2 (3.21×10$^{-3}$ M) in TMPTA was heated to 55° C. using water bath and then the solution was irradiated with He/Ne laser while maintaining temperature at 55° C with water bath. For 9, 12, and 16 sec. irradiation of this solution with He/Ne laser gave 1.7 mg, 3.2 mg, and 6.0 mg of polymeric spike, respectively. At room temerature this solution undergoes no polymerization by He/Ne laser beam.

Having described the invention in detail and by reference to preferred embodiments thereof, it will be apparent that modifications and variations are possible without departing from the scope of the invention defined in the appended claims.

What is claimed is:

1. A photohardenable composition which consists essentially of a free radical polymerizable compound, an electron donating coinitiator, and a benzospiropyran, wherein said benzospiropyran is characterized in that it undergoes ring opening to form a merocyanine upon exposure to a first actinic radiation of heat and said merocyanine generates a free radical upon exposure to a second actinic radiation which is the same as or different than said first actinic radiation and said composition is characterized in that free radicals generated by said benzospiropyran cause said composition to harden, wherein said benzospiropyran is represented by the Formula (I):

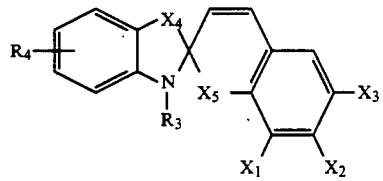

X$_4$ represents the atoms necessary to complete an indoline, 1,3-thiazazoloidine, 1,3-oxazalidine, pyrrolidine, 1,3-thiazine, 1,4-thiazine, 1,3-oxazine, piperidine, phenanthridine, acridine, quinoline, benzodithiole, benzoxathiazole, 2H-chromene, xanthene or dithiole ring wherein, when a methylene group is present in said ring, it is of the formula CR$^1$R$^2$ where R$^1$ and R$^2$ are defined below, X$_5$ represents O, S, Se or CR$^1$R$^2$ where R$^1$ and R$^2$ are the same or different and are selected from alkyl, arylalkyl, aryl, and hydrogen, R$_3$ represents alkyl, aralkyl, alkylamino, arylamino, or amido; X$_1$ and X$_3$ are the same or different and represent hydrogen, iodo, cyano, bromo, chloro, fluoro or amino provided at least one of the two groups X$_1$ and X$_3$ is not hydrogen; and X$_2$ represents hydrogen, alkoxy, a carboxy ester, or amino; and R$^4$ is hydrogen, fluoro, chloro, bromo, iodo, nitro, alkoxy, carboxy ester, aryl, amino, or cyano or R$^4$ represents the atoms necessary to complete a condensed benzene ring.

2. The photohardenable composition of claim 1 wherein said coinitiator is a tertiary amine or a borate salt.

3. The photohardenable composition of claim 1 wherein at least one of X$^1$ and X$^3$ is iodo.

4. The photohardenable composition of claim 1 wherein said composition additionally includes a sensitizer.

5. The photohardenable composition of claim 4 wherein said benzospiropyran is present in an amount of about 0.02 to 0.05 parts by weight, said polymerizable compound is present in an amount of about 50 to 99.7 parts, said coinitiator is present in an amount of about 0.2 to 1 parts, and said sensitizer is present in an amount up to about 1 part by weight.

6. The photohardenable composition of claim 1 wherein said first actinic radiation and said second actinic radiation are different.

7. The photohardenable composition of claim 6 wherein said merocyanine and said benzospiropyran have substantially different absorption maxima such that exposure of said benzospiropyran to said first radiation does into substantially generate free radicals and exposure of said benzospiropyran to said second radiation does not cause said benzospiropyran to undergo substantial ring opening to said merocyanine.

8. The photohardenable composition of claim 1 wherein said benzospiropyran is represented by the formula (II):

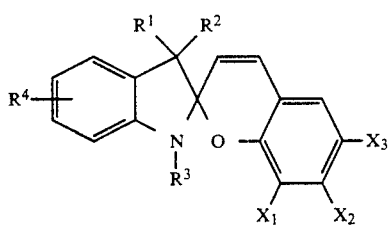
where $X_1$-$X_3$ and $R^1$-$R^4$ are defined as in claim 3.
9. The photohardenable composition of claim 8 wherein at least one of $X^1$ and $X^3$ is iodo.
* * * * *